United States Patent
Fujioka et al.

(10) Patent No.: US 6,939,760 B2
(45) Date of Patent: Sep. 6, 2005

(54) METHOD FOR SEMICONDUCTOR DEVICE MANUFACTURING TO INCLUDE MULTISTAGE CHEMICAL VAPOR DEPOSITION OF MATERIAL OXIDE FILM

(75) Inventors: Hirofumi Fujioka, Tokyo (JP); Kenichi Koyanagi, Tokyo (JP); Hiroyuki Kitamura, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 10/609,476

(22) Filed: Jul. 1, 2003

(65) Prior Publication Data

US 2004/0004870 A1 Jan. 8, 2004

(30) Foreign Application Priority Data

Jul. 2, 2002 (JP) .................................. 2002-194006

(51) Int. Cl.[7] ............................................. H01L 21/205
(52) U.S. Cl. ...................... 438/240; 438/396; 438/398; 438/785
(58) Field of Search ............................... 438/240, 253, 438/255, 396, 398, 591, 785

(56) References Cited

U.S. PATENT DOCUMENTS

| | | | |
|---|---|---|---|
| 2001/0024387 A1 * | 9/2001 | Raaijmakers et al. | 365/200 |
| 2002/0025628 A1 * | 2/2002 | Derderian et al. | 438/253 |
| 2002/0064927 A1 | 5/2002 | Lee et al. | |
| 2002/0115252 A1 * | 8/2002 | Haukka et al. | 438/240 |

FOREIGN PATENT DOCUMENTS

| | | |
|---|---|---|
| JP | 02-283022 A | 11/1990 |
| JP | 7-14986 A | 1/1995 |
| JP | 07-161931 A | 6/1995 |
| JP | 11-224938 A | 8/1999 |
| JP | 2000-021874 A | 1/2000 |
| JP | 2000-164831 A | 6/2000 |
| JP | 2000-294752 A | 10/2000 |
| JP | 2000-340559 A | 12/2000 |
| JP | 2001-35842 A | 2/2001 |
| JP | 2001-338922 A | 12/2001 |
| JP | 2002-164345 A | 6/2002 |
| JP | 2003-017685 A | 1/2003 |
| JP | 2003-282722 A | 10/2003 |
| JP | 2004-023043 A | 1/2004 |
| TW | 359869 A | 6/1999 |

OTHER PUBLICATIONS

Taiwanese Office Action Pertaining to Application TW 92117941 Filed on Jul. 1, 2003.

* cited by examiner

*Primary Examiner*—Stephen W. Smoot
(74) *Attorney, Agent, or Firm*—Sughrue Mion, PLLC

(57) ABSTRACT

There is provided a method for manufacturing a semiconductor device including a capacitor having a lower electrode, an upper electrode and a capacitive insulating film between the lower electrode and the upper electrode on a semiconductor substrate, wherein the capacitive insulating film is formed on the lower electrode over the semiconductor substrate using a chemical vapor deposition method, the method including: a lower electrode forming step of forming the lower electrode on the semiconductor, a dual-stage deposition step including a first stage for introducing a material gas containing a specified metal into a reactor in which the semiconductor substrate is placed and a second stage for subsequently introducing an oxidizing gas into the reactor, and wherein a metal oxide film as an oxide of the specified metal is formed on the lower electrode over the semiconductor substrate, by repeating the dual-stage deposition step two or more times, thereby forming the capacitive insulating film; and an upper electrode forming step of forming the upper electrode on the capacitive insulating film. Thus, it is possible to obtain the capacitive insulating film having good step coverage and a good film quality, without reducing throughput.

35 Claims, 9 Drawing Sheets

14; capacitive insulating film

16; capacitor
15; upper electrode
17; memory cell

METHOD FOR SEMICONDUCTOR DEVICE MANUFACTURING TO INCLUDE MULTISTAGE CHEMICAL VAPOR DEPOSITION OF MATERIAL OXIDE FILM

BACKGROUND OF THE INVENTION

1. Field of the Invention

The present invention relates to a method for manufacturing a semiconductor device and, more particularly, to the method for manufacturing the semiconductor device provided with a capacitor (information storage capacitance element), which is formed using a metal oxide film such as a tantalum oxide ($Ta_2O_5$) film as a capacitive insulating film.

The present application claims priority of Japanese Patent Application No. 2002-194006 filed on Jul. 2, 2002, which is hereby incorporated by reference.

2. Description of the Related Art

Large Scale Integrations (LSIs) known as a representative of semiconductor devices are roughly classified into memory products and logic products, the former of which, in particular, has been developed remarkably with advancing semiconductor device manufacturing technologies in recent years. Further, the memory products are classified into Dynamic Random Access Memories (DRAMs) and Static Random Access Memories (SRAMs), most of which are made up of Metal Oxide Semiconductor (MOS) transistors excellent in integration density. Further, the DRAMs, in particular, are greatly advantageous over the SRAMs because of improvement in integration density as described above and hence because of a reduction in cost, thereby finding wide applications in a variety of memory units in information devices or a like.

In a DRAM, each memory cell includes a memory cell selecting transistor made up of an MOS type switching transistor and a capacitor connected to the memory cell selecting transistor, to store information in accordance with whether charge is stored in the capacitor or not. Recently, however, an amount of information to be stored has increased with growth of an information-oriented society, to limit an area occupied by the capacitors to be formed on a semiconductor substrate. Therefore, it is necessary to produce increased capacitance of the capacitor of each memory cell. If the capacitor does not have capacitance large enough to store information, the DRAM readily malfunctions due to an influence of an external noise signal or a like, being subject to errors represented by a soft error.

Conventionally, as a capacitive insulating film of the capacitor of a DRAM, there has been used, for example, a silicon oxide ($SiO_2$) film, a silicon nitride (SiN) film, a metal oxide film such as a tantalum oxide film or a like. Of these potential capacitive insulating films, especially, the tantalum oxide film, which is a metal oxide film, has a large permittivity as compared to the silicon oxide film, the silicon nitride film, or the like. Therefore, by using the tantalum oxide film as the capacitive insulating film, it is possible to from the capacitor having large capacitance. Such the tantalum oxide film is typically formed by using a Chemical Vapor Deposition (CVD) method, because it is easy to do so.

When forming the tantalum oxide film by the CVD method conventionally, as described above, an oxidizing gas such as an oxygen gas is used together with a material gas containing tantalum in order to fill oxygen vacancies liable to occur in the tantalum oxide film when it is being formed and also to remove organic residue. If oxygen vacancies are generated in the tantalum oxide film, a leakage current may flow through the formed capacitor, resulting in formation of the capacitive insulating film having a poor film quality.

For example, Japanese Patent Application Laid-open No. Hei 7-14986 and Japanese Patent Application Laid-open No. 2001-35842 discloses a semiconductor device manufacturing method for introducing the material gas and the oxygen gas into a reaction chamber simultaneously to thus form the tantalum oxide film by a CVD method. Oxygen contained in the oxygen gas fills the vacancies and also removes the organic residue, thereby working to improve the film quality of the tantalum oxide film.

As shown in FIG. 10, formation of the tantalum oxide film is started by: placing a semiconductor substrate in a reactor (reaction chamber) kept at, for example, about 430° C. (deposition temperature) and at about 10 Torr (Torricelli) (deposition pressure); and, at a time t10, introducing into the reactor a material gas and the oxygen ($O_2$) gas at a same time on condition of respectively predetermined amounts of flow, wherein the material gas is obtained by spray and vaporizing, for example, tantalum pentaethoxide [Ta$(OC_2H_5)_5$: hereinafter may be referred to as PET], which is one of tantalum compounds, with a nitrogen ($N_2$) carrier gas. At a time t20 when a predetermined time has elapsed, introduction of the material gas and that of the oxygen gas are stopped simultaneously. In this case, the oxygen gas is used to fill oxygen vacancies liable to occur when the tantalum oxide film is being formed as described above and also to remove organic residue. Further, by a conventional semiconductor device manufacturing method using such a deposition sequence, the material gas is introduced in one continuous step, to form the capacitive insulating film having a finally required film thickness.

If the material gas and the oxygen gas are introduced into the reaction chamber simultaneously to form the tantalum oxide film as in the case of the conventional semiconductor device manufacturing method, a partial pressure of the material gas decreases. As a result, step coverage of the formed tantalum oxide film is deteriorated, so that film thickness of the capacitive insulating film formed on a surface of a lower electrode is liable to be non-uniform, thereby making it difficult to obtain stable capacitance of the capacitor when it is formed. In particular, when the lower electrode is a three-dimensional structure such as a cylinder or its surface shape is formed like a Hemispherical Silicon Grain (HSG) in order to increase the capacitance, the step coverage is deteriorated remarkably, to give rise to such a problem that a desired capacitance value cannot be obtained or upper and lower electrodes short-circuit with each other.

If the oxygen gas is introduced less to improve the step coverage, on the other hand, the oxygen works less correspondingly, to cause oxygen vacancies to occur in the tantalum oxide film and also organic residue to be accumulated, so that the film quality of the tantalum oxide film is deteriorated inevitably. Further, if a deposition rate is decreased by lowering a deposition temperature in order to improve the step coverage, not only the film quality is deteriorated but also much time is spent to form a film having a finally required film thickness.

A tantalum oxide deposition method for solving these problems by introducing the material gas in a non-oxidizing atmosphere to continuously form the tantalum oxide film until it has a finally required film thickness and then annealing the film in an oxidizing atmosphere to fill oxygen vacancies that have occurred in the tantalum oxide film is disclosed in, for example, Japanese Patent Application Laid-open No. 2000-340559.

However, by the tantalum oxide deposition method disclosed in Japanese Patent Application Laid-open No. 2000-340559, the tantalum oxide film is continuously formed until it has a finally required film thickness and annealed in the oxidizing atmosphere, thus giving rise to a problem that oxygen vacancies generated in the tantalum oxide film cannot completely be filled.

That is, by a semiconductor device manufacturing method by use of the tantalum oxide deposition method disclosed in Japanese Patent Application Laid-open No. 2000-340559, when forming the tantalum oxide film which makes up the capacitive insulating film of the capacitor, the oxygen gas is not introduced simultaneously with the material gas and so not influenced by the material gas, thereby improving step coverage. On the other hand, the material gas is continuously introduced at a constant flow rate to form the tantalum oxide film until it has the finally required film thickness and then the film is annealed in an oxidizing atmosphere, so that oxygen vacancies in the tantalum oxide film thus formed cannot completely be filled, thereby resulting in the capacitive insulating film having a poor film quality being formed when the capacitor is formed. Therefore, a leakage current flows trough the capacitor, to make it difficult for the capacitor to serve as an information storage capacitive element, resulting in deteriorated reliabilities of a relevant DRAM. In this case, in the tantalum oxide film manufacturing method disclosed in Japanese Patent Application Laid-open No. 2000-340559 as described above, if heat treatment for introducing the oxygen gas to supply a sufficient amount of oxygen to the oxygen vacancies in the formed tantalum oxide film is prolonged, a throughput is deteriorated inevitably. Furthermore, as duration of the heat treatment is prolonged, a surface of a polysilicon film or a like making up the lower electrode is oxidized, to form the silicon oxide film or a like having a small permittivity, thereby reducing a total capacitance value of the capacitor.

By such the conventional semiconductor device manufacturing method, it has been impossible to form the capacitive insulating film having good step coverage and a good film quality.

SUMMARY OF THE INVENTION

In view of the above, the present invention has been developed, and it is an object of the present invention to provide a method for manufacturing a semiconductor device that can form a capacitive insulating film having good step coverage and a good film quality, without reducing throughput.

According to a first aspect of the present invention, there is provide a method for manufacturing a semiconductor device including a metal oxide formed on a semiconductor substrate using a chemical vapor deposition method, the method including:

a dual-stage deposition step including a first stage for introducing a material gas containing a specified metal into a reactor in which the semiconductor substrate is placed and a second stage for subsequently introducing an oxidizing gas into the reactor, and wherein the metal oxide film as an oxide of the specified metal is formed on the semiconductor substrate, by repeating the dual-stage deposition step two or more times.

According to a second aspect of the present invention, there is provide a method for manufacturing a semiconductor device including a capacitor having a lower electrode, an upper electrode and a capacitive insulating film between the lower electrode and the upper electrode on a semiconductor substrate, wherein the capacitive insulating film is formed on the lower electrode over the semiconductor substrate using a chemical vapor deposition method, the method including:

a lower electrode forming step of forming the lower electrode on the semiconductor, a dual-stage deposition step including a first stage for introducing a material gas containing a specified metal into a reactor in which the semiconductor substrate is placed and a second stage for subsequently introducing an oxidizing gas into the reactor, and wherein a metal oxide film as an oxide of the specified metal is formed on the lower electrode over the semiconductor substrate, by repeating the dual-stage deposition step two or more times, hereby forming the capacitive insulating film; and an upper electrode forming step of forming the upper electrode on the capacitive insulating film.

According to a third aspect of the present invention, there is provided a method for manufacturing a semiconductor device including a metal oxide formed on a semiconductor substrate using a chemical vapor deposition method, the method including:

a dual-stage deposition step including a first stage for introducing a material gas containing a specified metal into a reactor, in which the semiconductor substrate is placed, to form the metal oxide film as an oxide of the specified metal on the semiconductor substrate, and a second stage for decreasing a flow rate of the material gas so as to be below the flow rate thereof at the first stage and introducing an oxidizing gas into the reactor to expose a surface of the metal oxide film to the oxidizing gas, and wherein the metal oxide film having a desired thickness is formed on the semiconductor substrate, by repeating the dual-stage deposition step two or more times.

In the foregoing first, second and third aspects, a first preferable mode is one wherein introduction of the material gas is stopped at the second stage.

A second preferable mode is one wherein the oxidizing gas to be introduced at the first stage is less than the flow rate of the oxidizing gas to be introduced at the second stage.

A third preferable mode is one wherein the material gas contains oxygen, whereby the specified metal is oxidized, even by only the material gas.

A fourth preferable mode is one wherein the dual-stage deposition step is repeated two to ten times.

A fifth preferable mode is one wherein in the repetition of the dual-stage deposition step, the oxidizing gas is introduced as a preliminary step before the primary dual-stage deposition step is started.

A sixth preferable mode is one wherein in the repetition of the dual-stage deposition step, the second stage in the final dual-stage deposition step is omitted.

A seventh preferable mode is one wherein tantalum, hafnium, or zirconium is used as the specified metal.

An eighth preferable mode is one wherein when using the tantalum as the specified metal, tantalum penta-ethoxide is used as the material gas.

A ninth preferable mode is one wherein as the oxidizing gas, such a gas is used as to contain oxygen, ozone, water, nitrogen oxide, or an oxygen radical.

A tenth preferable mode is one wherein duration of the first stage or the second stage is set to be longer than a mean residence time, in the reactor, of the material gas introduced at the first stage or the oxidizing gas introduced at the second stage respectively.

An eleventh preferable mode is one wherein a surface shape of the lower electrode of the capacitor is formed as a three-dimensional structure.

A twelfth preferable mode is one wherein the surface shape of the lower electrode is formed as a hemispherical silicon grain.

With the above configurations, since, in every second stage, the oxidizing gas can be used to fill oxygen vacancies and remove organic residue in the thin metal oxide layer stacked in every first stage, it is possible to improve a film quality sufficiently.

Further, since thus the oxidizing gas can thus be used to improve the film quality of the metal oxide film at the second stage, it is unnecessary to introduce the oxidizing gas at the first stage or, if necessary, only a small amount thereof needs to be introduced, thereby avoiding a decrease in partial pressure of the material gas at the first stage.

Therefore, it is possible to form a film provided with good step coverage and a good film quality without reducing the throughput.

BRIEF DESCRIPTION OF THE DRAWINGS

The above and other objects, advantages, and features of the present invention will be more apparent from the following description taken in conjunction with the accompanying drawings, in which.

PRINCIPLE OF THE INVENTION

Figure 6:
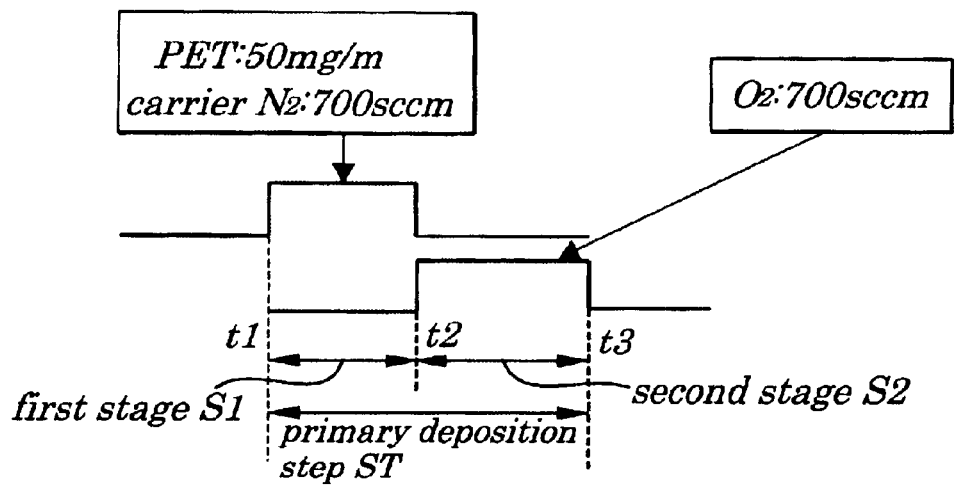
FIG. 6 is an explanatory view of a principle of the present invention.

The present inventor has devoted himself to study and has confirmed that a tantalum oxide film having a finally required film thickness can be formed by repeating two or more times a dual-stage deposition step ST (hereinafter may be referred simply to as deposition step) made up of, as shown in FIG. 6, a first stage S1 for introducing a material gas obtained by vaporizing tantalum pentaethoxide [Ta$(OC_2H_5)_5$: PET] by spraying a nitrogen gas to it into a reactor kept at a predetermined temperature and a predetermined pressure and a second stage S2 for introducing an oxygen gas into the reactor, so as to obtain good step coverage and a good film quality without reducing a throughput.

That is, by repeating a process of forming a tantalum oxide film having a thin thickness and a process of exposing the film thus formed to an oxidizing gas until a finally required film thickness is obtained, the tantalum oxide film can undergo filling-in of vacancies and removing of organic residue by use of the oxidizing gas in a condition where it is still thin in film thickness. It is thus possible to improve a film quality of the thin film sufficiently and hence the film quality of the tantalum oxide film having a finally required film thickness obtained by repetition of the deposition step. Further, in the tantalum oxide deposition process (first stage S1), the oxidizing gas is not introduced or is introduced only a little, so that it can be formed without reducing step coverage thereof. Therefore, the film need not be formed at a low temperature and deterioration in throughput can also be avoided.

FIG. 6 shows one example where, at the first stage S1, for example, PET is vaporized at a rate of 50 mg/m by spraying a nitrogen gas to it at a flow rate of 700 sccm (standard cubic centimeter per minute) and introduced into the reactor which is kept at about 430° C. (deposition temperature) and about 10 Torr (deposition pressure) and in which a semiconductor substrate is placed and, at the second stage S2, for example, an oxygen gas is introduced into the reactor at a flow rate of 700 sccm.

Figure 7:
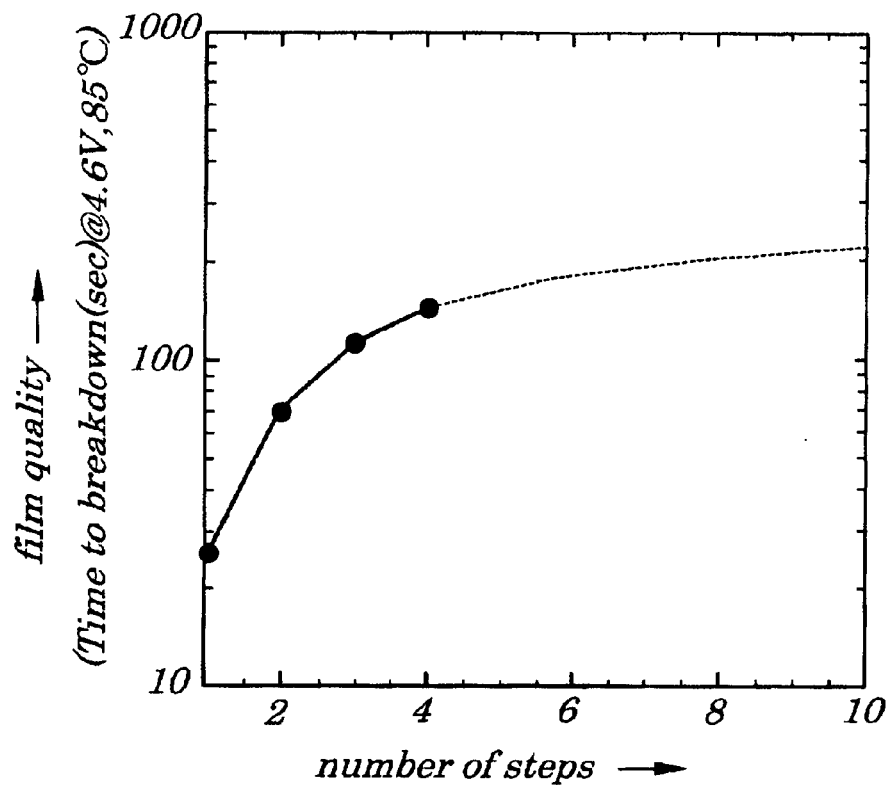
FIG. 7 is a graph for showing a relationship between the number of steps (horizontal axis) and a film quality of a tantalum oxide film (vertical axis) in a principle explanation of the present invention.

FIG. 7 shows a relationship between the number of the deposition steps (horizontal axis) and a film quality of a tantalum oxide film (vertical axis) in a case where the deposition step ST made up of the first stage S1 and the second stage S2 having these conditions is repeated two or more times so as to form a tantalum oxide film having a finally required film thickness. In this case, the film quality is given in terms of a characteristic of Time Dependent Dielectric Breakdown (TDDB) obtained by conducting an acceleration test on a capacitor formed using a formed tantalum oxide film, under such conditions that a voltage of 4.6V is applied across the capacitor in an atmosphere having a high temperature of 85° C. As is clear from FIG. 7, by increasing the number of times of repetitions of the deposition step ST, the film quality can be improved. For example, if the deposition step ST is repeated twice, a lapse of time of about 70 seconds leading up to breakdown of the tantalum oxide film is obtained in terms of the TDDB characteristic and, if the deposition step ST is repeated four times, the lapse of time is prolonged to about 150 seconds, both of which are longer than a time of about 27 seconds obtained when the deposition step ST is performed once, indicating that by increasing the number of times of repetitions of the deposition step ST, the film quality can be improved.

It is to be noted that it is necessary to select a duration of the first stage S1 at which a material gas is introduced and a duration of the second stage S2 at which an oxidizing gas is introduced to be longer than a mean residence time (V/F) of the material gas and that of the oxidizing gas respectively. In this case, V represents a volume of the reactor and F, a gas flow rate. Therefore, a maximum number of times of repetitions of the deposition step ST is determined by (finally required film thickness)/(film thickness obtained in minimum lapse of time by one cycle of the deposition step). As is clear from FIG. 7, although the film quality can be improved as the number of times of repetitions of the deposition step ST is increased, an excessive number of times of repetitions deteriorates a throughput, so that preferably the number of times of repetitions is from two to ten practically.

Further, the present inventor has confirmed that the film quality can be improved further by introducing an oxygen gas by such an amount as not to reduce step coverage at the first stage S1 at which a material gas is introduced.

Figure 8:
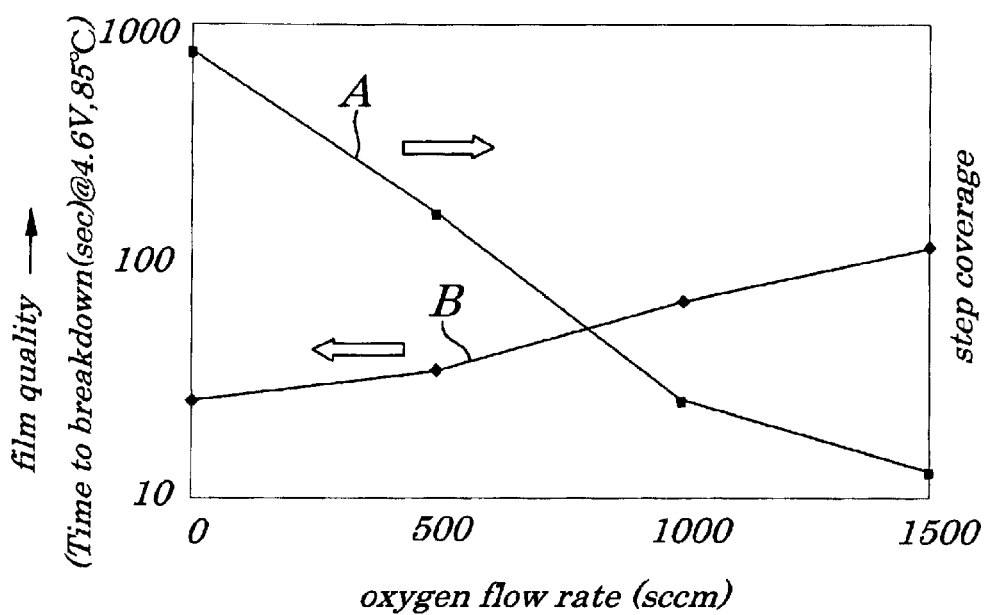
FIG. 8 is a graph for showing a relationship among a flow rate of oxygen (horizontal axis), a film quality (left-side vertical axis), and step coverage (right-side vertical axis) in the principle explanation of the present invention.

FIG. 8 shows a relationship among a flow rate of oxygen (horizontal axis), a film quality (left-side vertical axis), and step coverage (right-side vertical axis) in a case where an oxygen gas is introduced when a material gas is being introduced at the first stage S1. In the figure, A represents a characteristic of step coverage and B, a characteristic of a film quality. As is clear from FIG. 8, as the oxygen flow rate increases, the step coverage is reduced but the film quality is improved. The FIG. 8, therefore, indicates that the film quality can be improved by introducing oxygen (oxygen gas) by such an amount as not to reduce the step coverage substantially.

Further, the present inventor has confirmed that, when repeating two or more times the deposition step ST combining the first stage S1 for introduction of a material gas and the second stage S2 for introduction of an oxygen gas, by introducing the oxygen gas as a preliminary step before the primary deposition step ST is started, an incubation period of time can be reduced as compared to a case where an oxygen gas is not introduced.

Figure 9:
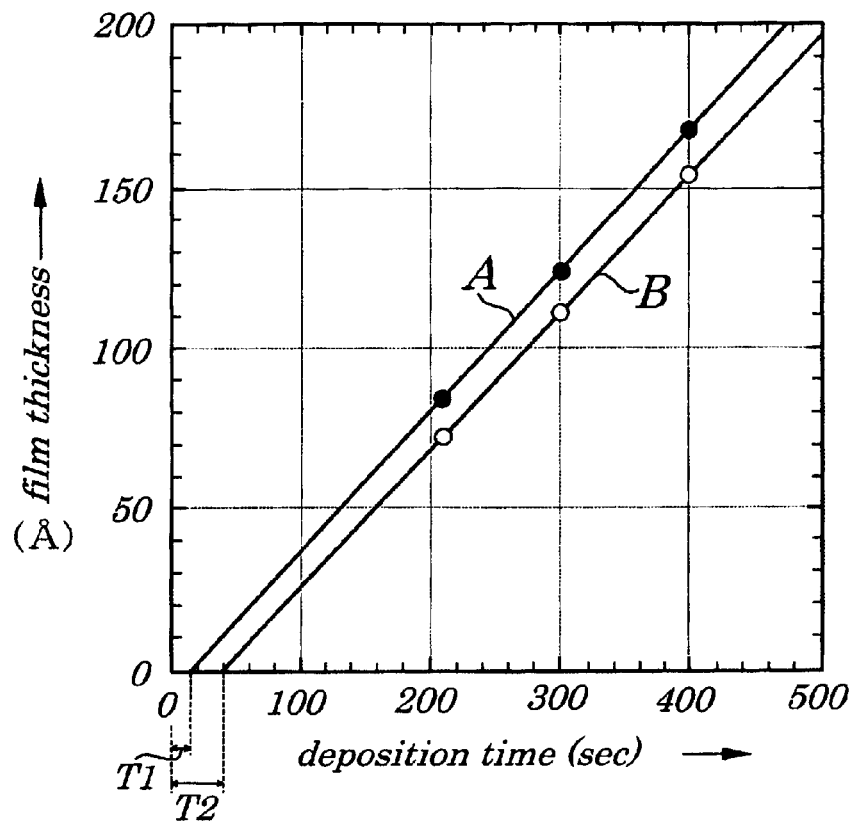
FIG. 9 is a graph for showing a relationship between a deposition time (horizontal axis) and a film quality (vertical axis) in the principle explanation of the present invention.
Figure 10:
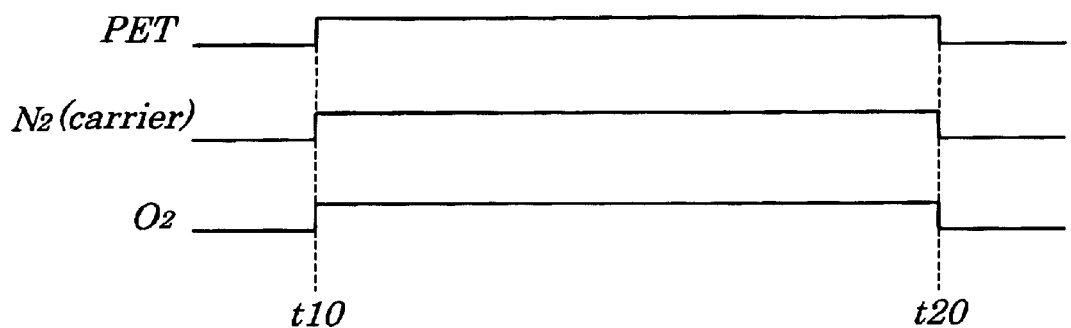
FIG. 10 is an illustration for showing a deposition sequence for forming a tantalum oxide film in a conventional semiconductor device manufacturing method.

In FIG. 9, A represents a characteristic in a case where an oxygen gas has been introduced and B, a characteristic in a case where it has not been introduced. As is clear from comparison between the two characteristics A and B, in the case where an oxygen gas has been introduced, the incubation period of time is about 18 seconds, as represented as T1 in the same figure, whereas in the case where an oxygen gas has not been introduced, the incubation period of time is about 40 seconds, as represented as T2 in the same figure, so that the incubation period of time can be at least halved. It is thus possible to reduce a lapse of time leading up to starting of deposition, thereby improving a throughput.

It is considered that the incubation period of time can thus be reduced because, by introducing an oxygen gas as the preliminary step before the primary deposition step ST is started, that is, prior to starting of deposition, as described above, PET can be easily decomposed thermally when the first stage S1 is performed subsequently to introduce a material gas in order to decompose the PET, thereby forming a tantalum oxide film.

DETAILED DESCRIPTION OF THE PREFERRED EMBODIMENTS

Best modes of carrying out the present invention will be described in further detail using various embodiments with reference to the accompanying drawings.

First Embodiment

The following will describe a semiconductor device manufacturing method according to the first embodiment with reference to FIGS. 1A–1E and FIG. 2.

Figure 1A:
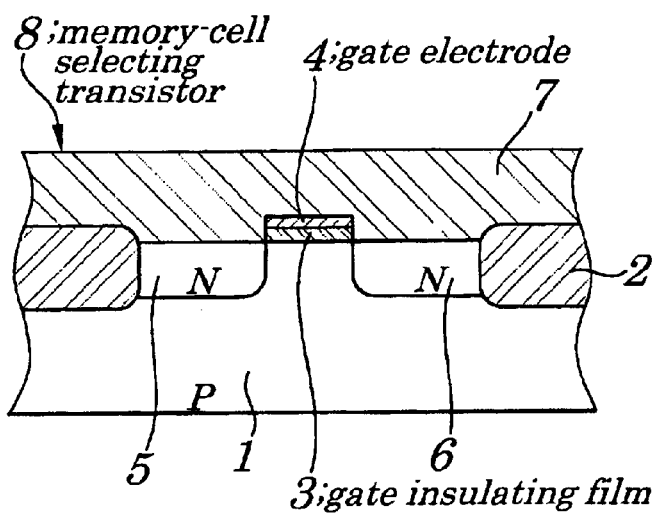
FIGS. 1A–1C show configurations of a semiconductor device manufacturing method, along steps thereof, according to a first embodiment of the present invention.

First, as shown in FIG. 1A, for example, a P-type semiconductor substrate 1 is used to form an element isolation region 2 by a known method such as LOCOS (Local Oxidation of Silicon) or STI (Shallow Trench Isolation), thereby forming a gate insulating film 3 made of, for example, a silicon oxide film and a gate electrode 4 made of, for example, a polysilicon film at a center of each active region. Next, by self-alignment by use of the gate electrode 4, ions of an N-type impurity are implanted to form one pair of N-type regions 5 and 6 serving as a source region and a drain region respectively; then, a first inter-layer insulating film 7 made of, for example, a silicon oxide film is formed throughout a surface, thereby forming a memory-cell selecting transistor 8 made up of an N-type MOS (NMOS) transistor.

Figure 1B:
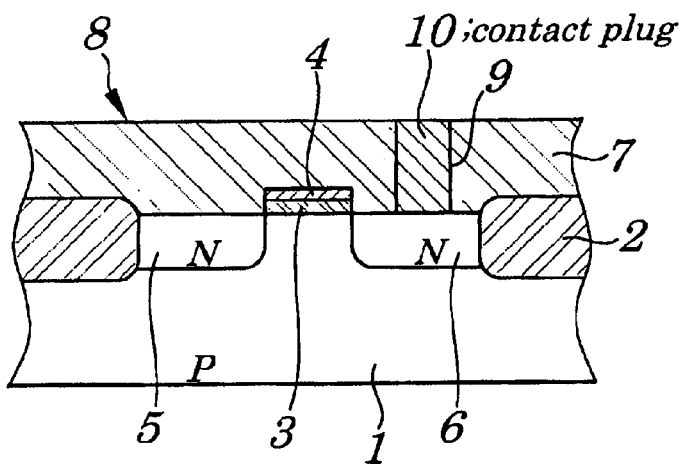

Next, as shown in FIG. 1B, a first contact hole 9 is formed by lithography in the first inter-layer insulating film 7 to expose one N-type region 6 of the memory-cell selecting transistor 8; then a contact plug 10 made of, for example, a polysilicon film is buried into the first contact hole 9, to connect with the N-type region 6.

Figure 1C:
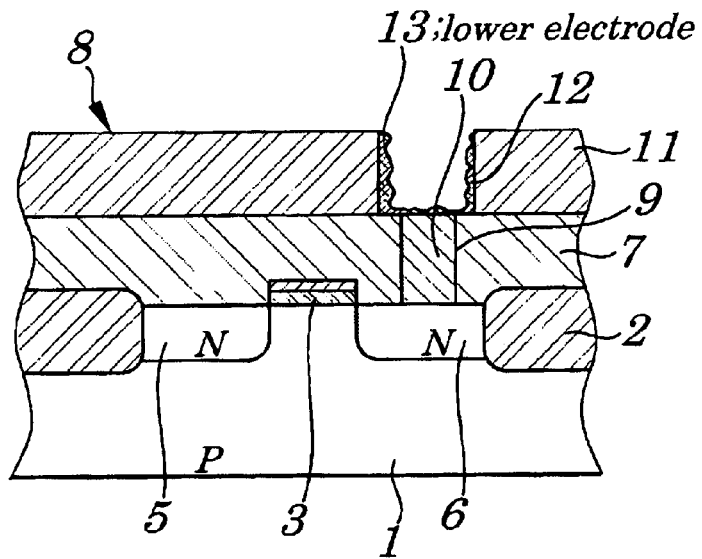

Next, as shown in FIG. 1C, a second inter-layer insulating film 11 made of, for example, a silicon oxide film is formed throughout the surface; then, a second contact hole 12 is formed by lithography in the second inter-layer insulating film 11 to expose the contact plug 10. Next, for example, a polysilicon film is shaped in a form of a cylindrical shape in the second contact hole 12 on its bottom and inner wall to be connected with the contact plug 10 in order to form its surface like an Hemispheric Silicon Grain, thereby forming a lower electrode 13.

Figure 1D:
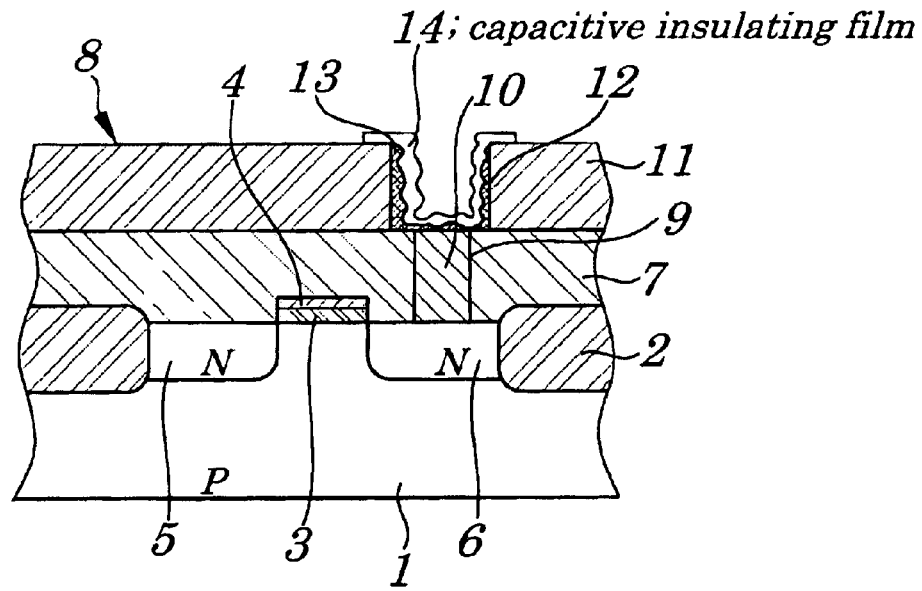
FIGS. 1D–1E continue to show the configurations of the semiconductor device manufacturing method along the steps thereof according to the first embodiment of the present invention.

Next, as shown in FIG. 1D, a tantalum oxide film is formed by Chemical Vapor Deposition in accordance with a deposition sequence such as described later, to form a capacitive insulating film 14 made of the tantalum oxide film on the lower electrode 13. The following will describe one example where a tantalum oxide film required to have a film thickness of 10 nm finally is formed in 300 seconds.

Figure 2:
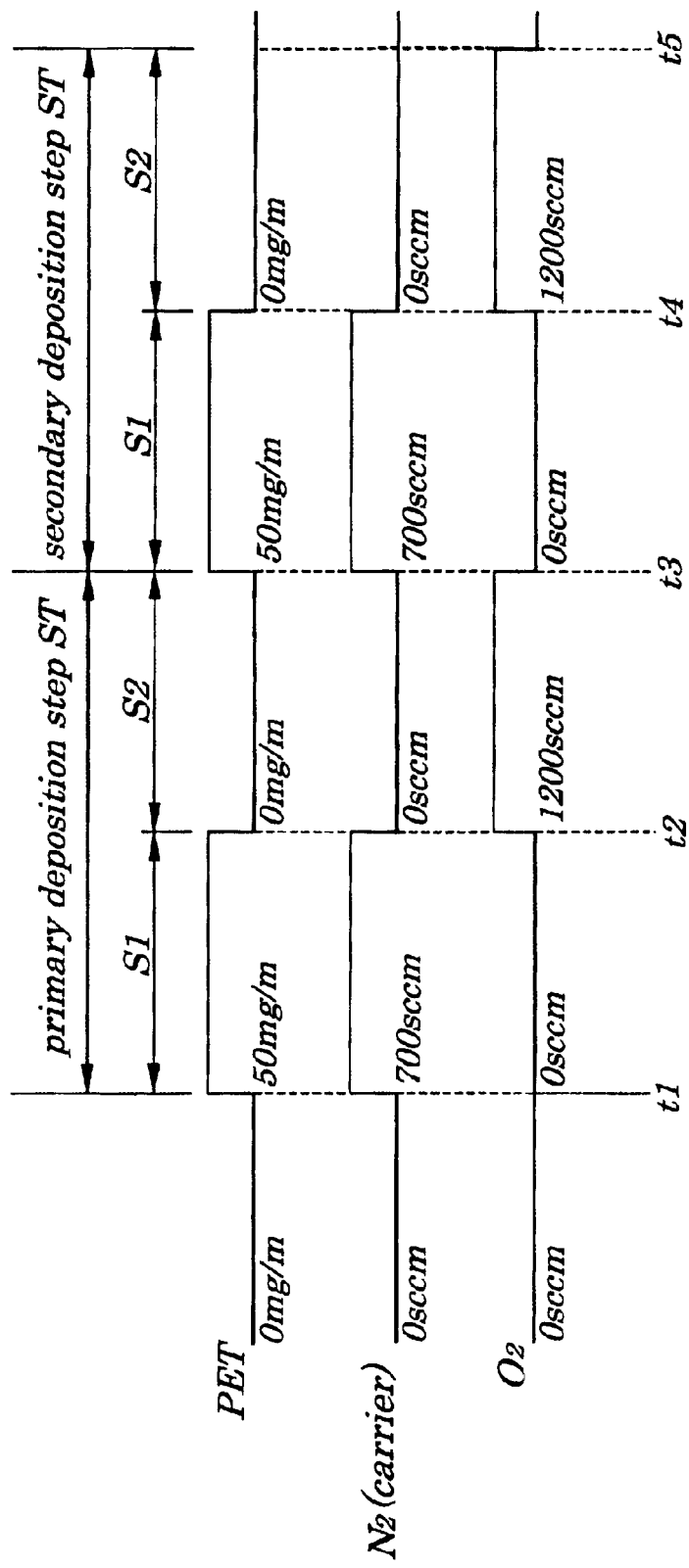
FIG. 2 is an illustration for showing a deposition sequence for forming a tantalum oxide film in the semiconductor device manufacturing method according to the first embodiment of the present invention.

With the configuration of the first embodiment, by repeating twice a dual-stage deposition step ST described in the paragraph of principle, a tantalum oxide film having a finally required film thickness is formed. That is, as shown in FIG. 2, the p-type semiconductor substrate 1 is placed in a reactor heated to about 430° C. (deposition temperature) and kept at about 10 Torr (deposition pressure); then, at time 1, a material gas obtained by vaporizing PET at a rate of 50 mg/m by spraying to it a nitrogen carrier gas at a flow rate of 700 sccm is introduced into the reactor in accordance with a first stage S1, to start forming the tantalum oxide film; and then, at a time t2 when 120 seconds has elapsed, introduction of the material gas is stopped. During this lapse of time of 120 seconds, a 5 nm-thick tantalum oxide film is formed. It is to be noted that although the thickness of a film to be formed varies with a temperature and a pressure in the reactor, a gas flow rate, or a like, their influences are supposed not to be taken into account for easy understanding. Next, during a lapse of time of 30 seconds between the times t2 and t3, an oxygen gas is introduced at a flow rate of 1200 sccm in accordance with a second stage S2, thereby completing a primary deposition step ST. In the primary deposition step ST, the 5 nm-thick tantalum oxide film formed at the first stage S1 is exposed to the oxygen gas introduced at the second stage S2, thereby filling oxygen vacancies and removing organic residue.

Subsequently, at the time t3, a material gas obtained by vaporizing PET at a rate of 50 mg/m by spraying to it a nitrogen carrier gas at a flow rate of 700 sccm is introduced in accordance with the first stage S1 to start forming a tantalum oxide film; then, at a time t4 when 120 seconds has elapsed, introduction of the material gas is stopped. During this lapse of time of 120 seconds, a 5 nm-thick tantalum oxide film is newly formed. Next, during a lapse of time of 30 seconds between the times t4 and t5, an oxygen gas is introduced at a flow rate of 1200 sccm in accordance with the second stage S2, thereby completing a secondary deposition step ST. In the secondary deposition step ST, the 5 nm-thick tantalum oxide film newly formed in the first stage S1 is exposed to the oxygen gas introduced at the second stage S2, thereby filling oxygen vacancies and removing organic residue as in the case of the primary deposition step ST. Then, the secondary deposition step ST is completed, forming on the lower electrode 13 the capacitive insulating film 14 made up of the tantalum oxide film having the finally required film thickness of 10 nm.

After the second stage S2 of the secondary deposition step ST is completed, the p-type semiconductor substrate 1 is moved into another reactor, to undergo annealing processing at, for example, 750–800° C. in an oxidizing atmosphere or oxygen radical processing, thereby stabilizing the tantalum oxide film. In this case, the annealing processing may be performed, omitting the second stage S2 of the secondary deposition step ST, which is the final deposition step. This holds true also with the following embodiments.

Figure 1E:
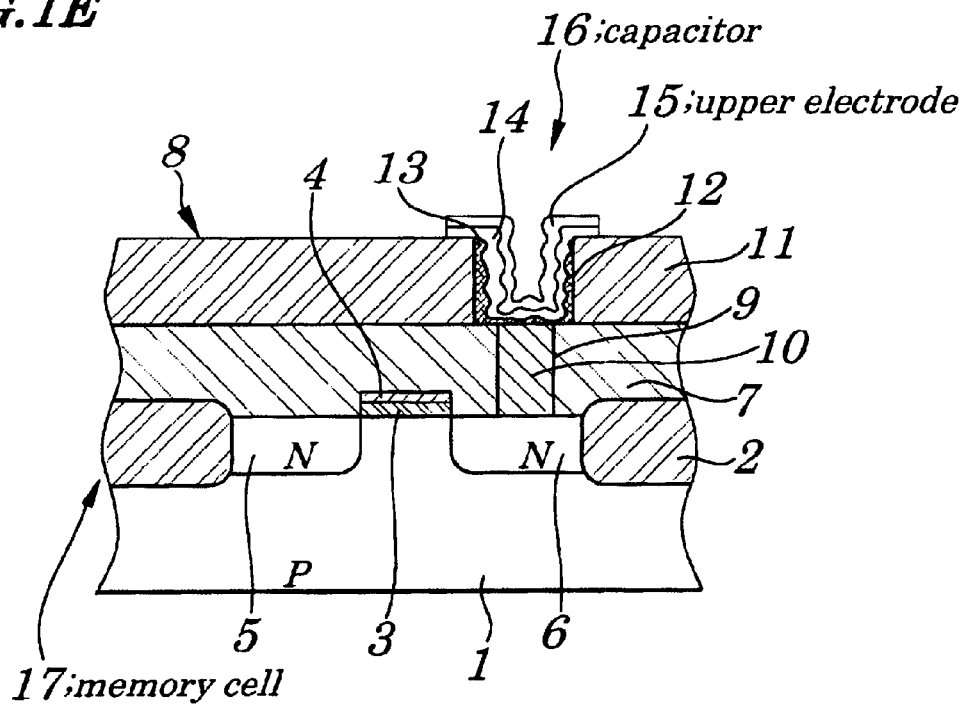

Next, as shown in FIG. 1E, an upper electrode 15 made of, for example, a polysilicon film is formed on the capacitive insulating film 14, thereby forming a capacitor 16. In such a manner, a memory cell 17 for storing one-bit information is completed, in which the capacitor 16 is connected through the contact plug 10 to one N-type region 6 of the memory-cell selecting transistor 8 made up of an NMOS transistor.

That is, when forming a tantalum oxide film as the capacitive insulating film 14 and having a finally required film thickness (10 nm), a process of forming the film is divided into two deposition steps of the primary deposition step ST and the secondary deposition step ST, in such a manner that a 5 nm-thick tantalum oxide film is formed at the first stage S1 of each of the deposition steps ST and then exposed to an oxygen gas at the second stage S2 of each of the deposition steps ST, thereby making it possible to fill oxygen vacancies and remove organic residue in the tantalum oxide film in a condition where it still has only a half the finally required film thickness. Therefore, in contrast to a conventional method of exposing a tantalum oxide film already formed to have the finally required film thickness to an oxygen gas at a time, the method of the embodiment enables performing processing effectively to fill the oxygen vacancies and remove the organic residue. Therefore, a formed capacitor 16 has a good film quality, thereby forming the capacitive insulating film 14 excellent in step coverage.

Thus, with the configuration of the first embodiment, after the memory-cell selecting transistor 8 is formed, the p-type semiconductor substrate 1 on which the lower electrode 13 is formed so as to be connected to one N-type region 6 of the memory-cell selecting transistor 8 is placed in a reactor; then, by repeating twice the deposition step ST combining the first stage S1 for introduction of a material gas and the second stage S2 for introduction of an oxygen gas, a tantalum oxide film having a finally required film thickness is formed to constitute the capacitive insulating film 14, thereby making it possible to suppress reduction in step coverage of the tantalum oxide film and fill oxygen vacancies and remove organic residue in the tantalum oxide film.

It is thus possible to form a capacitive insulating film 14 provided with good step coverage and a good film quality without reducing a throughput.

Second Embodiment

A semiconductor device manufacturing method of the present embodiment greatly differs in configuration from that of the first embodiment in a respect that a dual-stage deposition step ST described in the paragraph of principle is repeated three times to finally form a tantalum oxide film, which constitutes a capacitive insulating film and has a finally required film thickness (the same value of 10 nm as that of the first embodiment). The following will describe the semiconductor device manufacturing method with reference to FIG. 3.

Figure 3:
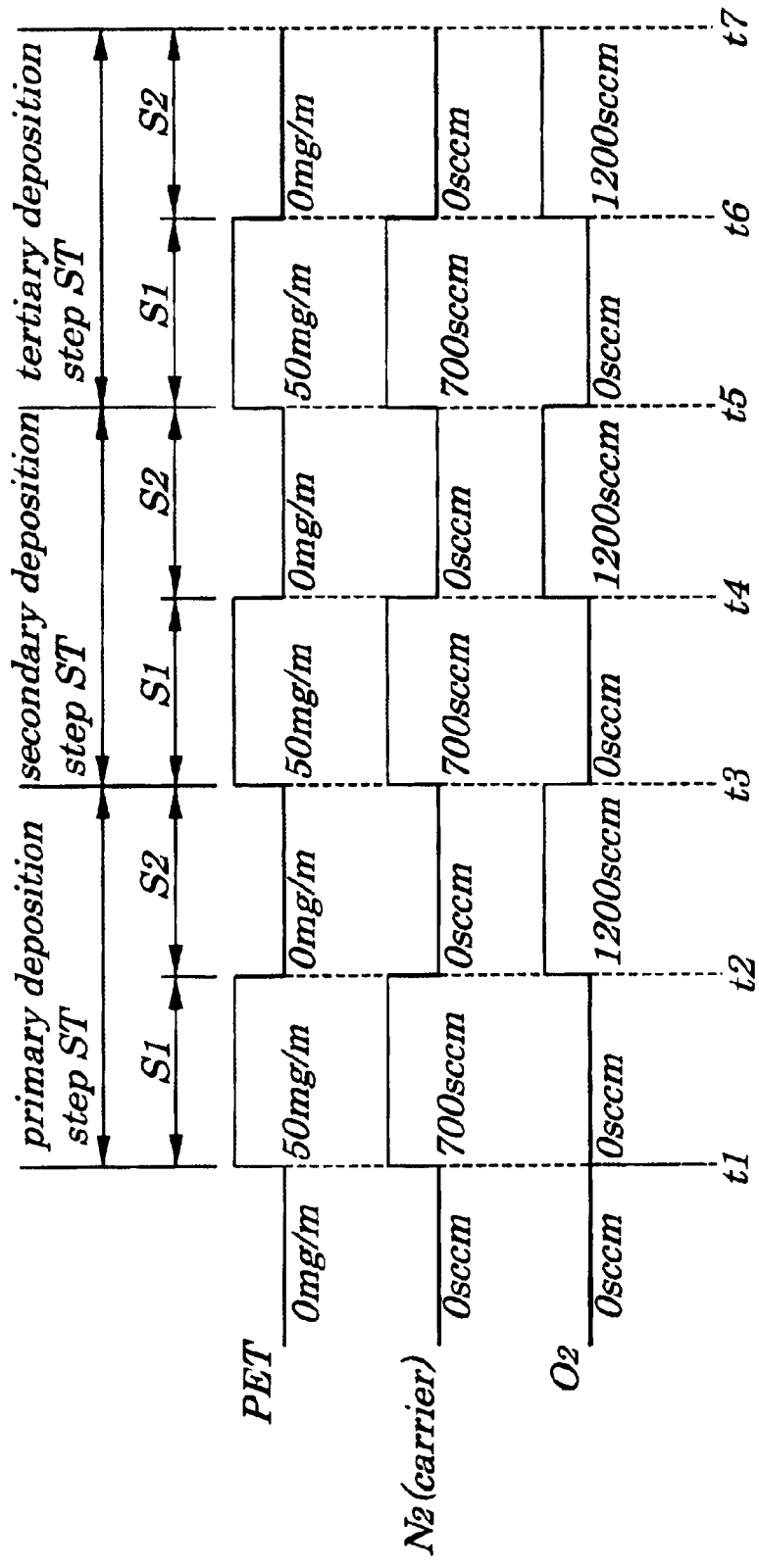
FIG. 3 is an illustration for showing a deposition sequence for forming a tantalum oxide film in a semiconductor device manufacturing method according to a second embodiment of the present invention.

That is, in a process of FIG. 1D of the first embodiment, a tantalum oxide film is formed in accordance with a deposition sequence of FIG. 3, to form capacitive insulating film 14 constituted of the tantalum oxide film on a lower electrode 13.

By the configuration of the second embodiment, the dual-stage deposition step ST described in the paragraph of principle is repeated three times to form a tantalum oxide film having a finally required film thickness (10 nm). That is, as is clear from FIG. 3, a p-type semiconductor substrate 1 is placed in a reactor heated to about 430° C. and kept at about 10 Torr; then, at a time t1, a material gas obtained by vaporizing PET at a rate of 50 mg/m by spraying to it a nitrogen carrier gas at a flow rate of 700 sccm is introduced into the reactor in accordance with a first stage S1, to start forming the tantalum oxide film; and then, at time 2 when 80 seconds has elapsed, introduction of the material gas is stopped. During this lapse of time of 80 seconds, about a 3.3 nm-thick tantalum oxide film is formed. Next, during a lapse of time of 20 seconds between the times t2 and t3, an oxygen gas is introduced at a flow rate of 1200 sccm in accordance with the second stage S2, thereby completing the primary deposition step ST. In this primary deposition step ST, the 3.3 nm-thick tantalum oxide film formed in the first stage S1 is exposed to the oxygen gas introduced at a second stage S2, thereby filling oxygen vacancies and removing organic residue.

Subsequently, during a lapse of time of 80 seconds between the times t3 and t4, the material gas described above is introduced in accordance with the first stage S1, to newly form a tantalum oxide film having a film thickness of about 3.3 nm; then, during a lapse of time of 20 seconds between the times t4 and t5, the oxygen gas is introduced in accordance with the second stage S2, thereby completing a secondary deposition step ST. In this secondary deposition step ST, the new 3.3 nm-thick tantalum oxide film formed in the first stage S is exposed to the oxygen gas introduced at the second stage S2, thereby filling oxygen vacancies and removing organic residue as in the case of the primary deposition step ST. Subsequently, during a lapse of time of 80 seconds between the times t5 and t6, the material gas is introduced in accordance with the first stage S1, to newly form a tantalum oxide film having a film thickness of about 3.3 nm; then, during a lapse of time of 20 seconds between the times t6 and t7, the oxygen gas is introduced in accordance with the second stage S2, thus completing a tertiary deposition step ST. In this tertiary deposition step ST, the new about 3.3 nm-thick tantalum oxide film formed in the first stage S1 is exposed to the oxygen gas introduced at the second stage S2, thereby filling oxygen vacancies and removing organic residue as in the case of the primary deposition step ST. Then, the tertiary deposition step ST is completed, forming on a lower electrode 13 the capacitive insulating film 14 constituted of the tantalum oxide film having the finally required film thickness of 10 nm. It is to be noted that a lapse of time for introducing the oxygen gas at the second stage S2 of each of the deposition steps ST in the present embodiment is set shorter than that of the first embodiment because a thinner film is to be formed at the first stage S1 of each of the deposition steps ST.

Further, with the present embodiment, the finally required film thickness is selected to be 10 nm and, also, the deposition step ST is repeated three times, so that the film thickness of a tantalum oxide film to be formed in each of the deposition steps ST only needs to be in a range of 1.7–5 nm. This value of the film thickness may be altered appropriately in accordance with a finally required film thickness or the deposition step ST.

Subsequently, as in the case of the first embodiment, annealing processing or a like is performed; then, almost the same process as that of FIG. 1E is repeated to form on the capacitive insulating film 14 and an upper electrode 15 made of, for example, a polysilicon film in order to form a capacitor 16, thereby completing a memory cell 17.

By the configuration of the second embodiment, when forming a tantalum oxide film constituting the capacitive insulating film 14 and having a finally required film thickness (10 nm), a process of forming the film is divided into three deposition steps of the primary through tertiary deposition steps ST, so that a 3.3 nm-thick tantalum oxide film is formed at the first stage S1 of each of the deposition steps ST and then exposed to an oxygen gas at the second stage S2 of each of the deposition steps ST, thereby making it possible to fill oxygen vacancies and remove organic residue in the tantalum oxide film in a condition where it still has only a third of the finally required film thickness. Therefore, the method of the present embodiment enables performing processing to fill the oxygen vacancies and remove the organic residue more effectively than that of the first embodiment because of the deposition step ST added further thereto.

Third Embodiment

A semiconductor device manufacturing method of the present embodiment greatly differs in configuration from that of the first embodiment in a respect that, when the dual-stage deposition step ST is repeated twice to finally form a tantalum oxide film having a finally required film thickness (the same 10 nm as in the case of the first embodiment), a small amount of an oxygen gas is introduced in addition to a material gas at a first stage S1 of each of the deposition steps ST as described in the paragraph of principle. In this case, an amount of oxygen to be introduced at the first stage is selected in such a manner as not to deteriorate coverage. The following will describe the semiconductor device manufacturing method with reference to FIG. 4.

Figure 4:
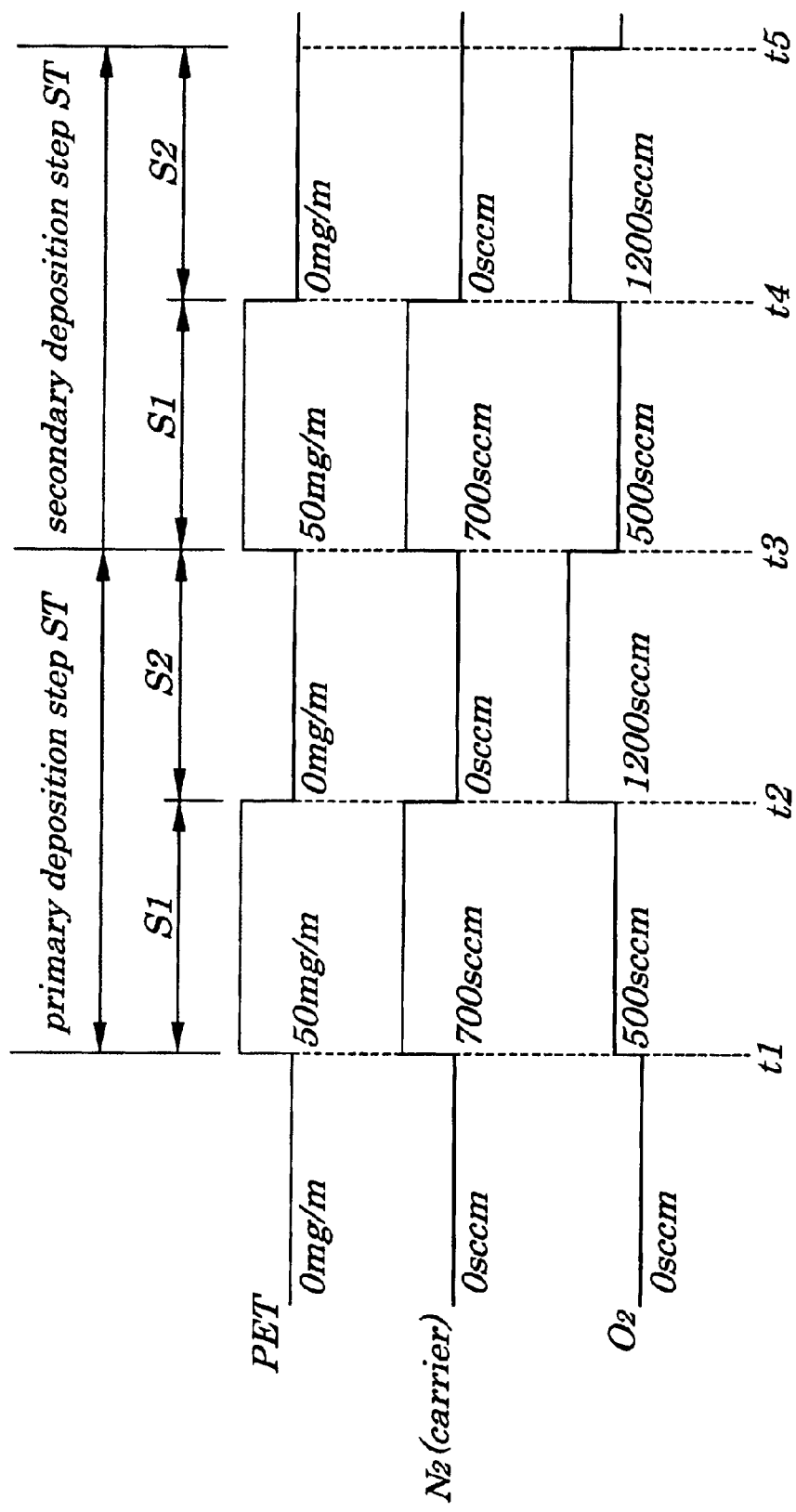
FIG. 4 is an illustration for showing a deposition sequence for forming a tantalum oxide film in a semiconductor device manufacturing method according to a third embodiment of the present invention.

That is, in the process of FIG. 1D of the first embodiment, a tantalum oxide film is formed in accordance with a deposition sequence of FIG. 4, to constitute a capacitive insulating film 14 made of the tantalum oxide film on a lower electrode 13.

With the configuration of the present embodiment, when a primary deposition step ST and a secondary deposition step ST are repeated to form a tantalum oxide film, a small amount of oxygen gas is introduced in addition to a material gas at the first stage S1 of each of the deposition steps ST as described in the paragraph of principle. That is, as is clear from FIG. 4, a p-type semiconductor substrate 1 is placed in a reactor heated to about 430° C. and kept at about 10 Torr; then, at a time t1 of the primary deposition step ST, in addition to a material gas obtained by vaporizing PET at a rate of 50 mg/m by spraying to it a nitrogen carrier gas at a flow rate of 700 sccm, oxygen gas is introduced at a flow rate of 500 sccm in accordance with the first stage S1, to start forming the tantalum oxide film; and then, at a time t2 when 120 seconds has elapsed, introduction of the material gas is stopped. During this lapse of time of 120 seconds, a 5 nm-thick tantalum oxide film is formed. Next, during a lapse of time of 30 seconds between the times t2 and t3, an oxygen gas is introduced at a flow rate of 1200 sccm in accordance with the second stage S2, thereby completing the primary deposition step ST. In this primary deposition step ST, the 5 nm-thick tantalum oxide film formed in the first stage S1 is exposed to the oxygen gas introduced at the second stage S2, thereby filling oxygen vacancies and removing organic residue. Further, by introducing the small amount of oxygen at the first stage S1, a film quality can be improved further.

Subsequently, during a lapse of time of 120 seconds between the times t3 and t4, the material gas and oxygen gas described above are introduced in accordance with the first stage S, to newly form a 5 nm-thick tantalum oxide film; then, during a lapse of time of 30 seconds between the times t4 and t5, the oxygen gas is introduced in accordance with the second stage S2, thereby completing a secondary deposition step S2. In this secondary deposition step ST, the new 5 nm-thick tantalum oxide film formed in the first stage S is exposed to the oxygen gas introduced at the second stage S2, thereby filling oxygen vacancies and removing organic residue as in the case of the primary deposition step ST. Further, by introducing the small amount of oxygen when forming the film at the first stage S1, the film quality can be improved further. Then, the secondary deposition step ST is completed, forming on the lower electrode 13 the capacitive insulating film 14 constituted of the tantalum oxide film having the finally required film thickness of 10 nm.

Subsequently, as in the case of the first embodiment, annealing processing or a like is performed; then, almost the same process as that of FIG. 1E is repeated to form on the capacitive insulating film 14 an upper electrode 15 made of, for example, a polysilicon film in order to form a capacitor 16, thereby completing a memory cell 17.

By the semiconductor device manufacturing method of the present embodiment, when forming a tantalum oxide film constituting the capacitive insulating film 14 and having a finally required film thickness (10 nm) in two times using the primary deposition step ST and the secondary deposition step ST, a small amount of oxygen gas is introduced in addition to a material gas at the first stage S1 in each of the deposition steps ST, thereby improving the film quality further than the first embodiment.

Fourth Embodiment

A semiconductor device manufacturing method of the present embodiment greatly differs in configuration from that of the first embodiment in a respect that, when the dual-stage deposition step ST is repeated twice to finally form a tantalum oxide film having a finally required film thickness (the same 10 nm as in the case of the first embodiment), a small amount of an oxygen gas is introduced as a preliminary step before a primary deposition step ST is started. The following will describe the semiconductor device manufacturing method with reference to FIG. 5

Figure 5:
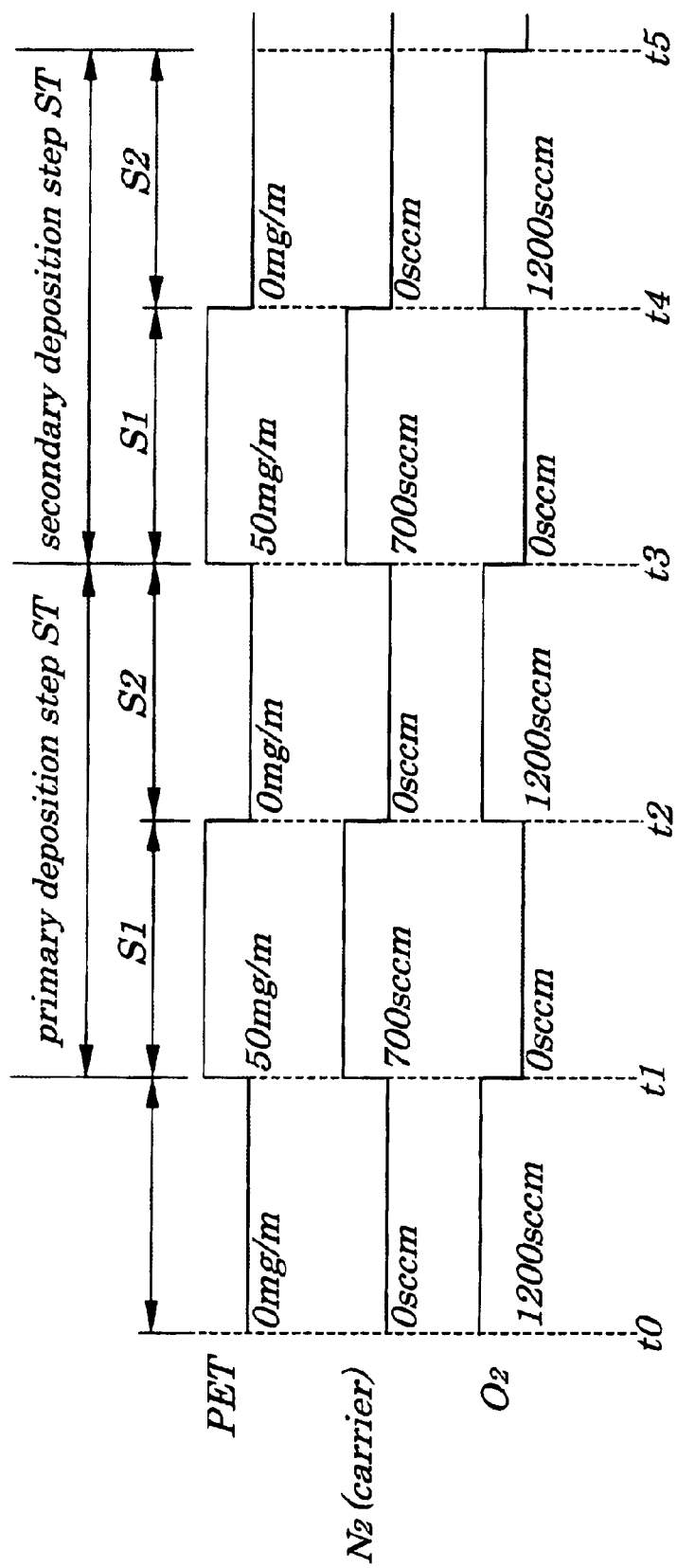
FIG. 5 is an illustration for showing a deposition sequence for forming a tantalum oxide film in a semiconductor device manufacturing method according to a fourth embodiment of the present invention.

That is, in the process of FIG. 1D of the first embodiment, a tantalum oxide film is formed in accordance with the deposition sequence of FIG. 5, to constitute a capacitive insulating film 14 made of the tantalum oxide film on a lower electrode 13.

With the configuration of the fourth embodiment, when a primary deposition step ST and a secondary deposition step ST are repeated to form a tantalum oxide film, oxygen gas is introduced before a primary deposition step ST as described in the paragraph of principle. That is, as is clear from FIG. 5, a p-type semiconductor substrate 1 is placed in a reactor heated to about 430° C. and kept at about 10 Torr; then, at a time t0 prior to the primary deposition step ST, an oxygen gas is introduced at a flow rate of 1200 sccm into the reactor. Next, from a time t1 onward, the film is formed under the same conditions as those of the first embodiment described with reference to the deposition sequence of FIG. 2, thereby forming on the lower electrode 13 and the capacitive insulating film 14 constituted of the tantalum oxide film having a finally required film thickness of 10 nm.

According to such a tantalum oxide film forming method, as described in the paragraph of principle, by introducing an oxygen gas as a preliminary step before the primary deposition step ST is started, an incubation period of time can be reduced as compared to a case where an oxygen gas is not introduced.

Subsequently, as in the case of the first embodiment, annealing processing or the like is performed; then, almost the same process as that of FIG. 1E is repeated to form on the capacitive insulating film 14 an upper electrode 15 made of, for example, a polysilicon film in order to form a capacitor 16, thereby completing a memory cell 17.

With the configuration of the fourth embodiment, it is possible to obtain almost the same effects as those of the first embodiment and also, by introducing an oxygen gas before deposition starts in contrast to the other embodiments, to supply oxygen beforehand prior to deposition, in order to hasten deposition, thereby reducing the incubation period of time.

It is apparent that the present invention is not limited to the above embodiments but may be changed and modified without departing from the scope and spirit of the invention. For example, although the embodiments have been described with reference to an example where the deposition step ST is repeated twice or three times to form a tantalum oxide film, the present invention is not limited to it; actually, as described in the paragraph of principle, the deposition step is repeated two to ten times practically. Further, a PET amount or a nitrogen carrier gas flow rate at the first stage S1 or an oxygen gas flow rate or a like at the second stage S2, which stages are combined in each of a plurality of deposition steps ST performed when forming a tantalum oxide film, are not limited to those described in the embodiments and can be altered arbitrarily in accordance with a required film quality of the tantalum oxide film. Further, when repeating the deposition step ST combining the first stage S1 and the second stage S2, introduction of a material gas need not completely be stopped at the second stage S2 unless a behavior of an oxidizing gas is damaged. Further, duration of the first stage S1 or that of the second stage S2 need not necessarily be set to a same value in the plurality of deposition steps ST.

Although the embodiments have been described in an example where a film thickness of a finally formed tantalum oxide film is selected to 10 nm, the film thickness is not limited to it and may be altered appropriately. It is to be noted that to alter the final film thickness, a thickness of a film to be formed in each of the deposition steps ST to be repeated can be altered appropriately in accordance with a required film quality or throughput. For example, if the final film thickness is 15 nm; when the film is formed in two deposition steps ST as in the case of the first, third, and fourth embodiments, the film may be formed to 7.5 nm in the primary deposition step ST, whereas when it is formed in three deposition steps ST as in the case the second embodiments, the film may be formed to 5 nm in each of the deposition steps ST, or when it is formed in a larger number of deposition steps to be repeated, the thickness of the film to be formed in each of the deposition steps ST may be selected appropriately in accordance with the number of times of repetitions.

Further, although a tantalum oxide film has been employed as a metal oxide film that constitutes a capacitor having large capacitance, the metal oxide film is not limited to it; for example, any other metals can be used such as hafnium (Hf) or zirconium (Zr). If hafnium is used in this case, hafnium butoxide [Hf(OC$_4$H$_9$)$_4$], tetra-kis 1-methoxy 2-methyl 2-propoxy hafnium [Hf(MMP)$_4$], or a like can be used as a source and, if zirconium is used, zirconium butoxide [Zr(OC$_4$H$_9$)$_4$], tetra-kis 1-methoxy 2-methyl 2-propoxy zirconium [Zr(MMP)$_4$], or the like can be used as the source. Further, although the embodiments have been described in an example where an oxygen gas is used as the oxidizing gas, the present invention is not limited to it; for example, such a gas can be used as to contain ozone ($O_3$), water ($H_2O$), nitrogen oxide ($N_2O$, $NO_x$), or oxygen radicals. The above-mentioned material gas containing metal such as tantalum, hafnium, or zirconium has such a property as to enable, by itself, forming a metal oxide film without a special oxidizing gas.

Further, preferably a temperature at which a metal oxide film is to be formed is not too low because a deposition rate is decreased as the temperature is decreased. In particular, at a low deposition temperature (for example, about 300–350° C.), a reaction is self-limited depending on a material gas employed, in which case only one atom layer of film is formed in some cases, thereby resulting in a great decrease in throughput undesirably. Therefore, preferably the deposition temperature is in such a temperature range that the reaction may not be self-limited, for example, 380–480° C.

Further, a gate insulating film of each of transistors that constitute a DRAM may be made of a nitride film or a double-film structure made up of an oxide film and a nitride film. That is, as far as it is of a Metal Insulator Semiconductor (MIS) type, the transistor may be, besides a MOS transistor, a Metal Nitride Semiconductor (MNS) transistor or a Metal Nitride Oxide Semiconductor (MNOS) transistor.

What is claimed is:

1. A method for manufacturing a semiconductor device comprising a metal oxide film formed on a semiconductor substrate using a chemical vapor deposition method, said method comprising:

a dual-stage deposition step comprising a first stage for introducing both a material gas containing a specified metal and an oxidizing gas into a reactor in which said semiconductor substrate is placed and a second stage for subsequently introducing a second oxidizing gas into said reactor;

wherein said oxidizing gas at said first stage is introduced in such a manner as to be less than a flow rate of said second oxidizing gas introduced at said second stage;

wherein said metal oxide film as an oxide of said specified metal is formed on said semiconductor substrate, by repeating said dual-stage deposition step two or more times; and a deposition temperature of said metal oxide film is set in such a temperature range that a reaction of said material gas is non-self-limited in one cycle of said dual-stage deposition step.

2. The method for manufacturing the semiconductor device according to claim 1, wherein introduction of said material gas is stopped at said second stage.

3. The method for manufacturing the semiconductor device according to claim 1, wherein
said oxidizing gas introduced at said first stage and said second oxidizing gas introduced at said second stage are the same type of gas.

4. The method for manufacturing the semiconductor device according to claim 1, wherein said material gas contains oxygen, whereby said specified metal is oxidized, even by only said material gas.

5. The method for manufacturing the semiconductor device according to claim 1, wherein said dual-stage deposition step is repeated two to ten times.

6. The method for manufacturing the semiconductor device according to claim 1, wherein in the repetition of said dual-stage deposition step, an oxidizing gas is introduced as a preliminary step before the primary dual-stage deposition step is started.

7. The method for manufacturing the semiconductor device according to claim 1, wherein in the repetition of said dual-stage deposition step, said second stage in the final dual-stage deposition step is omitted.

8. The method for manufacturing the semiconductor device according to claim 1, wherein tantalum, hafnium, or zirconium is used as said specified metal.

9. The method for manufacturing the semiconductor device according to claim 8, wherein when using said tantalum as said specified metal, tantalum penta-ethoxide is used as said material gas.

10. The method for manufacturing the semiconductor device according to claim 1, wherein said oxidizing gas and said second oxidizing gas contain oxygen, ozone, water, nitrogen oxide, or an oxygen radical.

11. The method for manufacturing the semiconductor device according to claim 1, wherein duration of said first stage or said second stage is set to be longer than a mean residence time, in said reactor, of said material gas introduced at said first stage or said second oxidizing gas introduced at said second stage, respectively.

12. A method for manufacturing a semiconductor device comprising a capacitor having a lower electrode, an upper electrode and a capacitive insulating film between said lower electrode and said upper electrode on a semiconductor substrate, wherein said capacitive insulating film is formed on said lower electrode over said semiconductor substrate using a chemical vapor deposition method, said method comprising:

a lower electrode forming step of forming said lower electrode on said semiconductor, a dual-stage deposition step comprising a first stage for introducing both a material gas containing a specified metal and an oxidizing gas into a reactor in which said semiconductor substrate is placed and a second stage for subsequently introducing a second oxidizing gas into said reactor;

wherein said oxidizing gas at said first state is introduced in such a manner as to be less than a flow rate of said second oxidizing gas introduced at said second stage;

wherein a metal oxide film as an oxide of said specified metal is formed on said lower electrode over said semiconductor substrate, by repeating said dual-stage deposition step two or more times, hereby forming said capacitive insulating film;

a deposition temperature of said metal oxide film is set in such a temperature range that a reaction of said material gas is non-self-limited in one cycle of said dual-stage deposition step; and an upper electrode forming step of forming said upper electrode on said capacitive insulating film.

13. The method for manufacturing the semiconductor device according to claim 12, wherein introduction of said material gas is stopped at said second stage.

14. The method for manufacturing the semiconductor device according to claim 12, wherein
said oxidizing gas introduced at said first stage and said second oxidizing gas introduced at said second stage are the same type of gas.

15. The method for manufacturing the semiconductor device according to claim 12, wherein said material gas contains oxygen, whereby said specified metal is oxidized, even by only said material gas.

16. The method for manufacturing the semiconductor device according to claim 12, wherein said dual-stage deposition step is repeated two to ten times.

17. The method for manufacturing the semiconductor device according to claim 12, wherein in the repetition of said dual-stage deposition step, an oxidizing gas is introduced as a preliminary step before the primary dual-stage deposition step is started.

18. The method for manufacturing the semiconductor device according to claim 12, wherein in the repetition of said dual-stage deposition step, said second stage in the final dual-stage deposition step is omitted.

19. The method for manufacturing the semiconductor device according to claim 12, wherein tantalum, hafnium, or zirconium is used as said specified metal.

20. The method for manufacturing the semiconductor device according to claim 19, wherein when using said tantalum as said specified metal, tantalum penta-ethoxide is used as said material gas.

21. The method for manufacturing the semiconductor device according to claim 12, wherein said oxidizing gas and said second oxidizing gas contain oxygen, ozone, water, nitrogen oxide, or an oxygen radical.

22. The method for manufacturing the semiconductor device according to claim 12, wherein duration of said first stage or said second stage is set to be longer than a mean residence time, in said reactor, of said material gas introduced at said first stage or said second oxidizing gas introduced at said second stage, respectively.

23. The method for manufacturing the semiconductor device according to claim 12, wherein a surface shape of said lower electrode of said capacitor is formed as a three-dimensional structure.

24. The method for manufacturing the semiconductor device according to claim 23, wherein said surface shape of said lower electrode is formed as a hemispherical silicon grain.

25. A method for manufacturing a semiconductor device comprising a metal oxide film formed on a semiconductor substrate using a chemical vapor deposition method, said method comprising:

a dual-stage deposition step comprising a first stage for introducing both a material gas containing a specified metal and an oxidizing gas into a reactor, in which said semiconductor substrate is placed, to form said metal oxide film as an oxide of said specified metal on said semiconductor substrate, and a second stage for decreasing a flow rate of said material gas so as to be below the flow rate thereof at said first stage, and said second stage for introducing a second oxidizing gas into said reactor;

wherein said oxidizing gas at said first stage is introduced in such a manner as to be less than a flow rate of said second oxidizing gas introduced at said second stage;

wherein said metal oxide film having a desired thickness is formed on said semiconductor substrate, by repeating said dual-stage deposition step two or more time; and a deposition temperature of said metal oxide film is set in such a temperature range that a reaction of said material gas is non-self-limited in one cycle of said dual-stage deposition step.

26. The method for manufacturing the semiconductor device according to claim 25, wherein introduction of said material gas is stopped at said second stage.

27. The method for manufacturing the semiconductor device according to claim 26, wherein duration of said first stage or said second stage is set to be longer than a mean residence time, in said reactor, of said material gas introduced at said first stage or said second oxidizing gas introduced at said second stage, respectively.

28. The method for manufacturing the semiconductor device according to claim 25, wherein said oxidizing gas introduced at said first stage and said second oxidizing gas introduced at said second stage are the same type of gas.

29. The method for manufacturing the semiconductor device according to claim 25, wherein said material gas contains oxygen, whereby said specified metal is oxidized, even by only said material gas.

30. The method for manufacturing the semiconductor device according to claim 25, wherein said dual-stage deposition step is repeated two to ten times.

31. The method for manufacturing the semiconductor device according to claim 25, wherein in the repetition of said dual-stage deposition step, an oxidizing gas is introduced as a preliminary step before the primary dual-stage deposition step is started.

32. The method for manufacturing the semiconductor device according to claim 25, wherein in the repetition of said dual-stage deposition step, said second stage in the final dual-stage deposition step is omitted.

33. The method for manufacturing the semiconductor device according to claim 25, wherein tantalum, hafnium, or zirconium is used as said specified metal.

34. The method for manufacturing the semiconductor device according to claim 33, wherein when using said tantalum as said specified metal, tantalum penta-ethoxide is used as said material gas.

35. The method for manufacturing the semiconductor device according to claim 25, wherein said oxidizing gas and said second oxidizing gas contain oxygen, ozone, water, nitrogen oxide, or an oxygen radical.

* * * * *